US005599723A

United States Patent [19]
Sato

[11] Patent Number: 5,599,723
[45] Date of Patent: Feb. 4, 1997

[54] METHOD FOR MANUFACTURING BIPOLAR TRANSISTOR HAVING REDUCED BASE-COLLECTOR PARASITIC CAPACITANCE

[75] Inventor: Fumihiko Sato, Tokyo, Japan

[73] Assignee: NEC Corporation, Japan

[21] Appl. No.: 626,441

[22] Filed: Apr. 2, 1996

Related U.S. Application Data

[63] Continuation of Ser. No. 361,993, Dec. 21, 1994, abandoned.

[30] Foreign Application Priority Data

Dec. 22, 1993 [JP] Japan .................... 5-323513

[51] Int. Cl.⁶ .................................... H01L 21/70
[52] U.S. Cl. ................. 437/31; 437/89; 437/90; 437/91; 437/92; 437/99; 437/101; 148/DIG. 10; 148/DIG. 11
[58] Field of Search .................. 437/31, 89, 90, 437/91, 92, 99, 101; 148/DIG. 10, DIG. 11

[56] References Cited

U.S. PATENT DOCUMENTS

| | | | |
|---|---|---|---|
| 4,534,820 | 8/1985 | Mori et al. ........................ | 437/84 |
| 4,753,709 | 6/1988 | Welch et al. ...................... | 156/643 |
| 4,975,381 | 12/1990 | Taka et al. ........................ | 437/33 |
| 5,134,454 | 7/1992 | Neudeck et al. .................. | 357/34 |
| 5,232,861 | 8/1993 | Miwa ................................ | 437/31 |
| 5,296,391 | 3/1994 | Sato et al. ........................ | 437/31 |
| 5,321,301 | 6/1994 | Sato et al. ........................ | 257/592 |
| 5,323,032 | 6/1994 | Sato et al. ........................ | 257/198 |
| 5,346,840 | 9/1994 | Fujioka ............................. | 437/31 |
| 5,391,503 | 2/1995 | Miwa et al. ................ | 148/DIG. 10 |
| 5,424,228 | 6/1995 | Imai .................................. | 437/31 |
| 5,432,104 | 7/1995 | Sato .................................. | 437/31 |
| 5,484,737 | 1/1996 | Ryun et al. ....................... | 437/31 |
| 5,494,836 | 2/1996 | Imai .................................. | 437/31 |
| 5,504,018 | 4/1996 | Sato .................................. | 437/31 |

FOREIGN PATENT DOCUMENTS

| | | | |
|---|---|---|---|
| 0053454 | 3/1989 | Japan ................................ | 437/31 |
| 0112770 | 5/1989 | Japan ................................ | 437/31 |
| 4011738 | 1/1992 | Japan ................................ | 437/31 |
| 4-322432 | 11/1992 | Japan . | |
| 4-330730 | 11/1992 | Japan . | |

*Primary Examiner*—John Niebling
*Assistant Examiner*—Long Pham

[57] ABSTRACT

In a process for manufacturing a bipolar transistor, an intrinsic base is formed by a selective epitaxial growth while the lower surface of a base electrode single crystal silicon film 33 and the surface of a collector epitaxial layer 3 are exposed. In this process, the intrinsic base 8 and an extrinsic base 34 are grown as a single crystal to form a self-alignment type bipolar transistor having a reduced parasitic capacitance between the base and the collector.

9 Claims, 5 Drawing Sheets

1

METHOD FOR MANUFACTURING BIPOLAR TRANSISTOR HAVING REDUCED BASE-COLLECTOR PARASITIC CAPACITANCE

This is a Continuation of application Ser. No. 08/361,993, filed on Dec. 21, 1994 now abandoned.

FIELD OF THE INVENTION

This invention relates to a method for manufacturing a semiconductor device, and particularly to a method for manufacturing a bipolar type semiconductor device.

BACKGROUND OF THE INVENTION

A known bipolar type semiconductor device, a bipolar transistor, is as disclosed in Japanese Patent Application Laid-open No. 4-330730.

FIG. 1 is a longitudinally-sectional view showing this conventional semiconductor device. In this semiconductor device, a high-concentration $N^+$-type collector buried region 2 which contains arsenic as an impurity is selectively formed on a $P^-$-type single crystal silicon substrate 1 having a resistivity of 10 to 20 Ωcm, and an $N^-$-type single crystal epitaxial layer 3 having an impurity concentration of $5 \times 10^{15}$ $cm^{-3}$ is formed at a thickness of 1.0 μm over the whole surface of the buried region 2. The epitaxial layer 3 is separated into a plurality of island regions by oxide films 4 which are formed to extend to the substrate 1 by a well-known selective oxidation method. In FIG. 1, only one island region 3 corresponding to the buried region 2 is illustrated. The island type region 3 is further separated into two parts by an oxide film 4' extending to the buried region 2. One part of the island region 3 at the left side is designed to act as a collector region while the other part at the right side is designed to act as an $N^+$-type collector draw-out region 5 and thus it is subjected to a phosphor diffusion treatment in a subsequent process to be highly doped. Through this process, a silicon substrate or body 100 is formed.

The substrate 100 is covered with a silicon nitride film 7, through which an opening 101 for partially exposing the collector region 3 and for forming a base and an opening 102 for exposing the collector draw-out region 5 are formed. Preferably, a thin silicon oxide film is formed beneath the silicon nitride film 7.

A $P^+$-type polycrystalline silicon film 6 is selectively formed on the silicon nitride film 7, and it is designed to horizontally extend from the edge of the opening 101 toward the center of the opening 101, and a P-type polycrystalline silicon film 9 is further formed on the lower surface of the extended portion of the silicon film 6 toward the collector region 3. In addition, a P-type base region 8 of single crystal silicon is formed on the exposed portion of the collector region 3 by an epitaxial growth method, and the polycrystalline silicon film 9 and the base region 8 contact each other.

Further, an $N^+$-type polycrystalline silicon layer 11 is formed at the opening 102 in contact with the collector draw-out region 5. The base region 8 and the polycrystalline silicon films 6 and 9 are covered with silicon oxide films 13 and 14 except for an emitter forming portion. An N-type emitter region 10 of single crystal silicon is formed on the exposed portion of the base region 8, and an emitter electrode 12-1, a base electrode 12-2 and a collector electrode 12-3 of aluminum are formed in contact with the emitter region 10, the polycrystalline silicon film 6 and the polycrystalline silicon layer 11, respectively. This transistor is hereinafter referred to as the "first transistor".

In addition to the above publication, Japanese Patent Application No. 4-322432 discloses a technique for crystallizing polycrystalline silicon for a base electrode to obtain a single crystal silicon by a solid phase epitaxial growth method.

Such a crystallizing technique as described above will be described in detail with reference to FIG. 2.

In this technique, a buried collector layer 2, an epitaxial layer 3 and an oxide film 110 are successively formed in this order on a Si substrate 1, and an opening 120 is formed through the oxide film 110. Subsequently, an amorphous SiGe film is formed on the exposed epitaxial layer 3 and oxide film 110, and then it is replaced by a single crystal SiGe film 8 and a polycrystalline SiGe film 9 using the solid phase epitaxial growth method. Thereafter, an emitter film 10 is formed on the single crystal SiGe film 8. This transistor is hereinafter referred to as the "second transistor". In FIG. 2, reference numerals 111, 112 each denote a silicon oxide film, 200 an emitter electrode, 201 a base electrode, 202 a collector electrode, 11 a collector film, 57 a collector wall layer, 54 a trench for element isolation, 55 a $P^+$-type layer for channel cut, and 56 a silicon oxide film.

Through this process, the base-collector junction capacitance can be reduced, and the base layer and the base electrode draw-out layer can be formed in self-alignment.

However, the semiconductor devices as described above have the following problems.

With respect to the first transistor, when SiGe is grown as an intrinsic base by a selective epitaxial growth method, the growth rate of polycrystalline SiGe is lower than that of single crystal SiGe (epitaxial SiGe). The difference in growth rate is dependent on the concentration of Ge. For example, for Ge=10%, i.e. for $Si_{0.9}Ge_{0.1}$, the ratio of the polycrystalline SiGe growth rate to the epitaxial SiGe growth rate (poly/epi growth rate ratio) is equal to ⅕ to ¼. Therefore, when the thickness of the base region 8 is made thin enough to maintain the necessary characteristics of the transistor, the thickness of the silicon nitride film 7 should be made thinner. As a result, the distance between the polycrystalline silicon film 6 and the collector region 3 is shortened, so that the parasitic capacitance between the base and the collector is increased.

With respect to the second transistor, the polycrystalline SeGe deposited in the same process is subjected to the solid phase epitaxial growth treatment to form the intrinsic base 8 and the base film 9. Accordingly, the thickness of the base film is substantially equal to that of the intrinsic base. In order to improve a cut-off frequency $f_T$, the thickness of the intrinsic base must be reduced. However, in this case the thickness of the base film is also reduced, resulting in increase of a base resistance $R_b$. That is, a trade-off is imposed between $f_T$ and $R_b$, so that the transistor cannot be improved in performance as a whole.

SUMMARY OF THE INVENTION

An object of the present invention is to provide a semiconductor device having high performance and reduced base-collector parasitic capacitance, and in particular to provide a manufacturing method for such a semiconductor device.

In order to attain the above object, according to the present invention, there is provided a method for manufacturing a semiconductor device, comprising:

a first step of forming a first insulation film on the surface of a first conduction type single crystal semiconductor layer;

a second step of forming on the first insulation film a first single crystal semiconductor film of a second conduction type through which a first opening is selectively formed;

a third step of forming a second insulation film on the upper surface of the first single crystal semiconductor film and on the side surface of the first single crystal semiconductor film defining the first opening;

a fourth step of selectively removing the first insulation film using the second insulation film and the first single crystal semiconductor film as a mask to form through the first insulation film a second opening which is larger than the first opening;

a fifth step of growing a second single crystal semiconductor film of a second conduction type on the exposed surface of the sigle crystal semiconductor layer within the second opening and growing a third single crystal semiconductor film of a second conduction type on the exposed lower surface of the first single crystal semiconductor film so that the second and third single crystal semiconductor films are connected to each other; and a sixth step of forming a third insulation film between the second insulation film and the second single crystal semiconductor film so as to cover the exposed side surface of the third single crystal semiconductor film.

The single crystal semiconductor layer and the first to third single crystal semiconductor films may be made of silicon.

The single crystal semiconductor layer and the first single crystal semiconductor film may be made of silicon, and the second and third single crystal semiconductor films may be made of silicon-germanium.

The first and third insulation films may be made of silicon oxide, and the second insulation film may be made of silicon nitride.

A metallic silicide film may be formed on the first single crystal semiconductor film in the second step.

In one feature of the present invention, a single crystal semiconductor of a first conduction type is formed on the surface of a semiconductor substrate, an area of the single crystal semiconductor being used as the single crystal semiconductor layer, and, in the second step, after a third opening is formed through the first single crystal semiconductor film at a portion corresponding to the other area of the single crystal semiconductor, an amorphous semiconductor is deposited, then, by a solid phase epitaxial growth method using the single crystal semiconductor at the other area in the third opening as a seed crystal, the amorphous semiconductor is crystallized to a single crystal semiconductor, and then a patterning of the crystallized single crystal semiconductor is carried out to obtain the first single crystal semiconductor film.

The method may further comprise a seventh step of forming a fourth single crystal semiconductor film of a first conduction type on the exposed surfacre of the second single crystal semiconductor film after the sixth step. A polycrystalline silicon film may be formed on the fourth single crystal semiconductor film in the seventh step.

The method may further comprise a eighth step of forming a polycrystalline silicon film of a first conduction type on the exposed surfcre of the second single crystal semiconductor film after the sixth step and diffusing impurities of a first conduction type from the polycrystalline silicon film to the second single crystal semiconductor film by heat treatment to form a first conduction type impurity diffusion area.

According to the present invention, increase in the parasitic capacitance between the base and the collector due to the difference in poly/epi growth rate ratio at the selective epitaxial growth can be suppressed.

Further, according to the present invention, since the intrinsic base and the base electrode silicon are formed in different steps, the trade-off between $f_T$ and $R_b$ can be moderated.

DESCRIPTION OF THE PREFERRED EMBODIMENTS

Preferred embodiments according to the present invention will be described hereunder with reference to the accompanying drawings.

Figure 3:
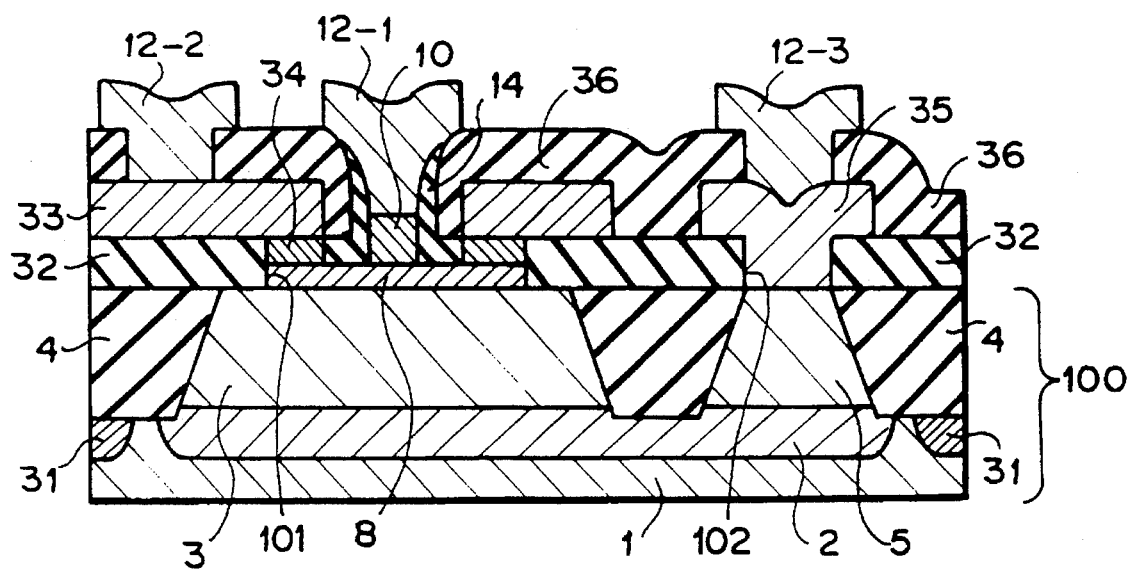
FIG. 3 is a longitudinally-sectional view showing a first embodiment of a semiconductor device obtained according to the present invention.

A first embodiment of the semiconductor device obtained by a manufacturing method according to the present invention will be described with reference to FIG. 3.

An $N^+$-type collector buried region 2, into which, for example, arsenic ions are selectively doped at a dose of $1 \times 10^{16}$ cm$^{-2}$ and an energy of 70 keV by an ion implantation, is formed on a $P^-$-type (100)-oriented single crystal silicon substrate 1 having a resistivity of 10 to 20 $\Omega$cm. Boron ions are selectively doped at a dose of $1 \times 10^{13}$ cm$^{-2}$ and an energy of 100 keV into a channel stopper buried region 31. An $N^-$-type single crystal epitaxial layer 3 having a phosphor concentration of about $1 \times 10^{16}$ cm$^{-3}$ and a thickness of about 0.7 µm is formed over the whole surface of the silicon substrate 1. The epitaxial layer 3 is separated into plural island regions by oxide films 4 which are formed to extend to the substrate 1 by the well-known selective oxidation method. In FIG. 3, only a part of the epitaxial layer 3 corresponding to the buried region 2 is illustrated as an island region. The island region is further separated into two parts by the oxide film 4 extending to the buried regions 2 and 31. A part of the island region at the left side is designed to act as a collector region. The other part at the right side is designed to act as an $N^+$-type collector draw-out region 5 and thus it is subjected to a phosphor ion implantation treatment in a subsequent process so as to be highly doped. Through this process, a substrate or body 100 is formed.

The substrate 100 is covered with a silicon oxide film 32 of a thickness of about 100 nm. The silicon oxide film 32 is designed so that an opening 101 for partially exposing the collector region 3 through the silicon oxide film 32 and for forming a base and an opening 102 for exposing the collector draw-out region B are formed. A $P^+$-type single crystal silicon film 33, into which boron ions are doped at a dose of $5\times10^{15}$ cm$^{-2}$ and at an energy of 10 keV by the ion implantation, is selectively formed at a thickness of about 200 nm on the silicon oxide film 32, and the silicon film 33 is formed to extend from the edge of the opening 101 horizontally by about 200 nm. A P-type single crystal silicon film layer 34 (about 50 nm in thickness, $6\times10^{18}$ cm$^{-3}$ of boron concentration) is formed on the lower surface of the extended portion of the silicon film 33 toward the collector region 3. On the other hand, a P-type intrinsic base region 8 which is formed of single crystal silicon and has boron concentration of about $6\times10^{18}$ cm$^{-3}$ is formed at a thickness of about 60 nm on the exposed portion of the collector region 3, and the single crystal silicon film 34 and the intrinsic base region 8 contacted one another.

The dimension of the extended portion of the silicon film 33 is preferably larger than the thickness of the intrinsic base region 8.

An N-type single crystal silicon film 35 is formed at the opening 102 so as to contact the collector draw-out region 5. The base region 8 and the single crystal silicon films 33 and 34 are covered with a silicon nitride film 36 and a silicon oxide film 14 except for the emitter forming portion. Further, an N-type emitter region 10 of single crystal silicon is formed at the exposed portion of the base region 8. An emitter electrode 12-1, a base electrode 12-2 and a collector electrode 12-3 which are formed of aluminum contact the emitter region 10, the single crystal silicon film 33 and the single crystal silicon film 35, respectively.

Next, essential steps of a method for manufacturing the semiconductor device according to the present invention will be described with reference to FIGS. 4A to 4E. In the following description, only specific steps which are different from the process as disclosed in the Japanese Patent Application Laid-open No. 4-330730 will be described.

Figure 4A:
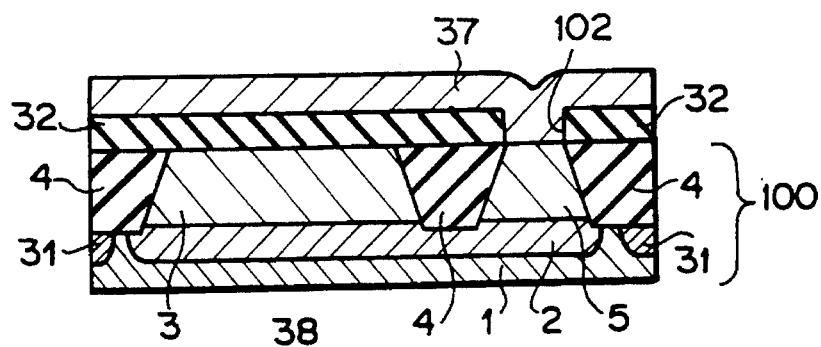
FIGS. 4A to 4E are diagrams showing an essential steps of the manufacturing method according to the present invention.

First, referring to FIG. 4A, the whole surface of a $P^-$-type (100)-oriented silicon substrate 1 which has the resistivity of 10 to 20 Ωcm is oxidized to form an oxide film having a thickness of about 6000 Å, and a photoresist is patterned on the oxide film with a normal lithography process. The SiO$_2$ film is selectively etched with HF-based etchant using the photoresist as a mask to remove a portion of the SiO$_2$ film which is not covered by the photoresist, and then the photoresist is removed.

In order to reduce the damage which will occur in a subsequent ion implantation process and in order to form an alignment pattern used in a subsequent lithography process, the $P^-$-type Si substrate 1 which has been subjected to the SiO$_2$ patterning treatment is oxidized to a thickness of 500 Å in depth. Subsequently, ion implantation of As is performed to selectively form an $N^+$-type buried region 2 only at the region where the SiO$_2$ film of about 6000 Å as described above is removed. An example of ion implantation condition is 70 keV and 5E15 ($5\times10^{15}$) cm$^{-2}$. A heat treatment is conducted for three hours at a temperature of 1100° C. after the ion implantation. Through this process, damage caused by the ion implantation is reduced and arsenic which is doped in order to reduce the collector resistance is diffused. Thereafter, the surface SiO$_2$ film on the substrate is removed from the whole surface thereof with the HF-based etchant. In this process, ion implantation is used. However, the same $N^+$-type buried layer may be formed by conducting the heat treatment on a film coated containing arsenic in high concentration to diffuse arsenic. Antimony Sb may be used as impurity.

Subsequently, a channel stopper $P^+$-type buried layer 31 is formed to prevent formation of an inversion layer on the $P^-$-type silicon substrate beneath the selective oxide film 4 which is formed for element isolation. A condition for forming the layer 31 is, for example, as follows: The surface of the substrate is oxidized by about 400 Å, and thereafter a photoresist is applied and left only on a predetermined area in a lithography process to conduct the ion implantation of boron using the photoresist as a mask. An ion implantation condition is, for example, 110 keV and 1E14 ($1\times10^{14}$) cm$^{-2}$. A heat treatment is conducted at 1000° C. under nitrogen atmosphere for one hour.

Subsequently, the oxide film on the surface of the substrate is completely removed with HF-based etchant, and then an N-type silicon epitaxial layer 3 is grown. SiH$_4$ or Si$_2$H$_2$Cl$_2$ is used as raw gas, PH$_3$ is used as doping gas, and the growth temperature is set to 1000° to 1100° C. Through this process, the epitaxial layer in which an area of $1\times10^{19}$ cm$^{-3}$ or less in the impurity concentration is formed at a thickness of about 0.7 µm and the average concentration from the surface to a transition region to the buried region is equal to about $1\times10^{16}$ cm$^{-3}$.

Thereafter, an SiO$_2$ film is formed at a thickness of about 500 Å on the surface, and a silicon nitride film is deposited on the surface of the SiO$_2$ film by the LPCVD method. At this time, the temperature is set to 700° to 900° C. and a mixture of SiH$_2$Cl$_2$ and NH$_3$ gases is used for reaction. A photoresist patterning treatment is conducted in the lithography process, and the silicon nitride film is etched by a dry etching method using the photoresist as a mask. If the dry etching treatment is finished at the time when the surface of the SiO$_2$ film of about 500 Å beneath the silicon nitride film is etched by about 100 to 200Å, the silicon nitride film can be perfectly etched without damaging the substrate side. Thereafter, the photoresist is removed. The selective oxidation is carried out using the patterned silicon nitride film as a mask to form the selective oxide film 4. For example, when the selective oxidation is carried out at 1000° C. in steam for 4 hours, an oxide film of about 8000 Å in thickness can be formed.

Subsequently, the silicon nitride film which was used as the mask is perfectly removed by immersing in phosphoric acid H$_3$PO at about 130° C. for one hour.

Thereafter, a silicon oxide film 32 is deposited at a thickness of about 1000 Å on the surface of the substrate, and only the silicon oxide film on an area where a collector electrode will be formed is subjected to the lithography and the dry etching treatment to perform the patterning of the silicon oxide film 32. Thereafter, the ion implantation of phosphor is performed at a dose of $5\times10^{14}$ cm$^{-2}$ and at an energy of 70 keV, and the heat treatment is conducted at a temperature of 900° C. under nitrogen atmosphere after the resist is removed. Subsequently, amorphous silicon 37 is deposited on the whole surface of the substrate at about 500° C. using Si$_2$H$_6$ as raw gas. Through these processes, the intermediate product shown in FIG. 4A is obtained.

Figure 4B:
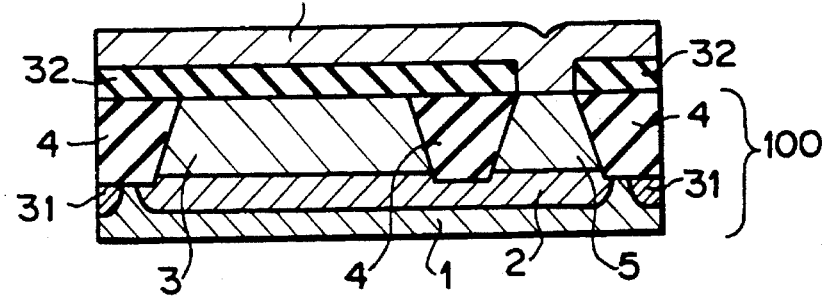

Subsequently, the amorphous silicon 37 is subjected to a heat treatment, for example a laser annealing treatment, to change the amorphous silicon 37 into a single crystal silicon 38 in the solid phase epitaxial growth using the single crystal silicon exposed at the opening 102 as a core or seed crystal. This is shown in FIG. 4B.

The single crystal silicon thus formed is patterned by the lithography and the dry etching treatment, and then the photoresist is removed.

Figure 4C:
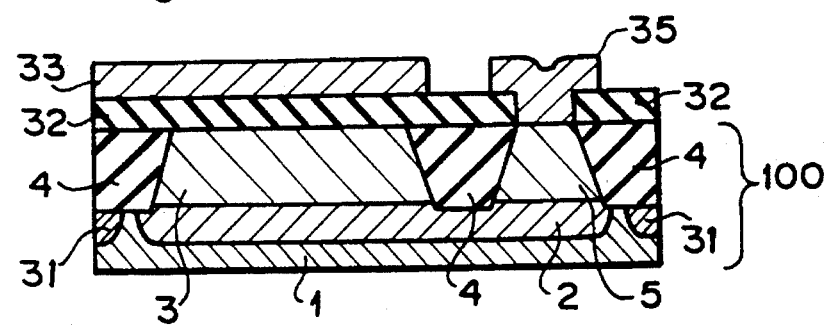

Next, the patterning treatment is conducted by the lithography so that an opening is formed through the photoresist above the single crystal silicon 33 for the base electrode, then the ion implantation is carried out using the photoresist as a mask at 10 keV to dope boron at a dose of $5\times10^{15}$ cm$^{-2}$, and then the photoresist is removed. Through the same process, phosphor is doped into the single crystal silicon 35 for the collector electrode at a dose of $5\times10^{14}$ cm$^{-2}$ and at an energy of 50 keV. Subsequently, the single crystal silicon at the region in which boron or phosphor is doped is annealed at 610° C. in a furnace. This is shown in FIG. 4C.

Thereafter, a silicon nitride film 36 is deposited at a thickness of about 2400 Å by a normal LPCVD method. Subsequently, the photoresist is applied and made to form an opening at a portion thereof corresponding to an emitter region by the lithography, and the silicon nitride film 36 and the single crystal silicon 33 are continuously etched using the photoresist as a mask by an anisotropic dry etching treatment. Thereafter, the photoresist is removed, a silicon nitride film is deposited on the surface thereof at a thickness of about 1200 Å by the LPCVD method, and then the insulating silicon nitride film is removed to a depth of about 1500 Å from the surface by the anisotropic dry etching treatment. Further, the silicon oxide film is side-etched laterally by about 0.2 μm with HF-based etchant.

Figure 4D:
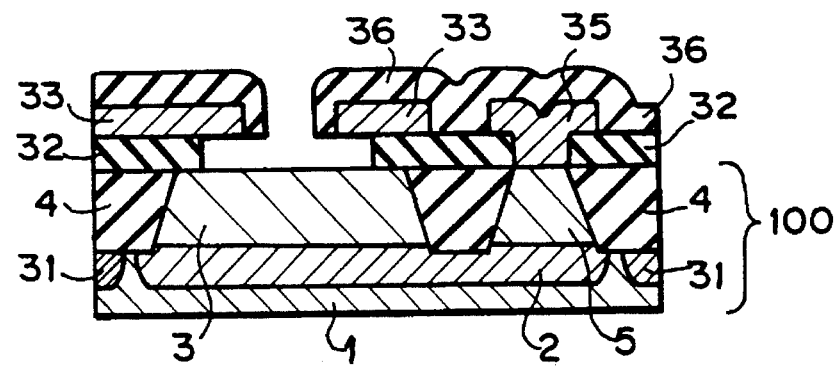

As a result, the upper surface of the N$^-$-type silicon epitaxial layer 3 is exposed at only a portion thereof corresponding to a base region. The single crystal silicon film 33 for base electrode is designed to project horizontally to the upper side of the base region. The distance from the end of the projection to the sidewall of the silicon oxide film 32 is set to about 2000 Å, and the lower surface of the projection is exposed by the length corresponding to the distance. This is shown in FIG. 4D.

Figure 4E:
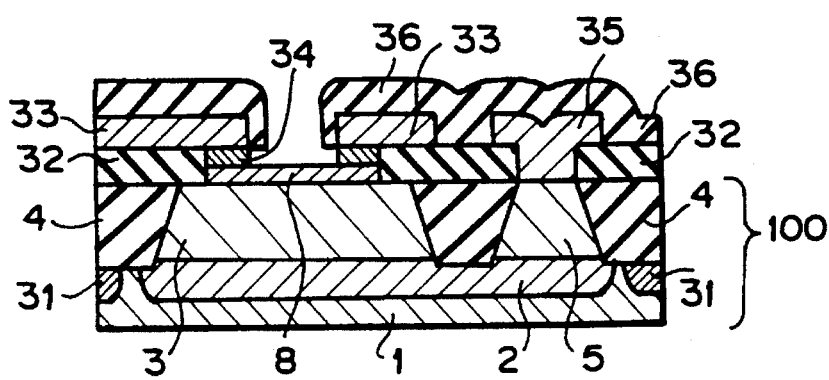

Subsequently, a single crystal silicon film 8 containing P-type impurities is grown on the surface of the exposed epitaxial layer 3 as shown in FIG. 4E, and at the same time a single crystal silicon film 34 containing P-type impurities is grown on the exposed lower surface of the single crystal silicon film 33. In order to perform the above process, the substrate is washed and immersed in HF-based etching agent for a short time (for example, for 30 seconds in 130BHF) as a pre-treatment to remove a natural oxide film, and then a wafer is placed in an ultra high vacuum/chemical vapor deposition (UHV/CVD) apparatus. Thereafter, the heat treatment is conducted on the wafer at 850° C. for about 10 minutes in the apparatus to perfectly remove the residual of the natural oxide film which is imperfectly removed and thus remains even through the above etching pre-treatment. If this heat treatment is insufficient, a subsequent selective epitaxial growth tends to be imperfectly performed.

Subsequently, the base is grown by an UHV/CVD method. The base growth condition is as follows: substrate temperature of 605° C., Si$_2$H$_6$ flow rate of 12 sccm, pressure of about $5\times10^{-4}$ Torr, selective growth of silicon film at a rate of 100 Å/min.

B$_2$H$_6$ is used as doping gas to grow a P-type silicon film. The flow rate of B$_2$H$_6$ is determined to obtain a predetermined P-type impurity concentration. Under the above condition, an epitaxial film is grown to form an intrinsic base 8 having about 600 Å thickness and boron concentration of $6\times10^{18}$ cm$^{-3}$. In this case, it is needless to say that a single crystal silicon extrinsic base film 34 is also selectively grown. The selective growth as described above is continued until the intrinsic base 8 and the single crystal silicon extrinsic base 34 are connected to each other. FIG. 4E shows a state in which the intrinsic base 8 and the extrinsic base 34 are connected to each other.

Through this process, the growth of the intrinsic base 8 and the electrical connection between the intrinsic base 8 and the single crystal silicon 33 can be simultaneously performed in one step. The final thickness of the intrinsic base 8 is about 600 Å, and the final thickness of the extrinsic base 34 is about 500 Å. The growth of the base 8 may be performed using the LPCVD method for performing growth under pressure of several Torrs, or other epitaxial growth methods such as a molecular beam epitaxial method, etc.

Subsequently, a silicon oxide film 14 is deposited on the whole surface of the exposed portion by the LPCVD method, and then etched back by the dry etching treatment. The wafer is placed in the UHV/CVD apparatus again for the treatment to leave the silicon oxide film 14 on the side walls of the extrinsic base 34 and the silicon nitride film 36. Subsequently, emitter single crystal silicon 10 is grown to a thickness of about 1000 Å on a portion of the intrinsic base 8 which is coated with no insulation film while N-type impurities are doped in the growing emitter single crystal silicon 10 at a concentration of $1\times10^{19}$ cm$^{-3}$.

In a subsequent process, holes for metal electrodes of the base and the collector are formed in the silicon nitride film 36, an aluminum film is deposited on the whole surface, and then aluminum electrodes 12-1, 12-2 and 12-3 remain at the emitter, base and collector portions respectively by the lithography. As a result, a semiconductor device shown in FIG. 3 can be obtained.

The embodiment as described above relates to an NPN transistor, however, it can be applied to a PNP transistor by changing the type of impurities.

Next, a second embodiment will be described with reference to FIG. 5.

Figure 5:
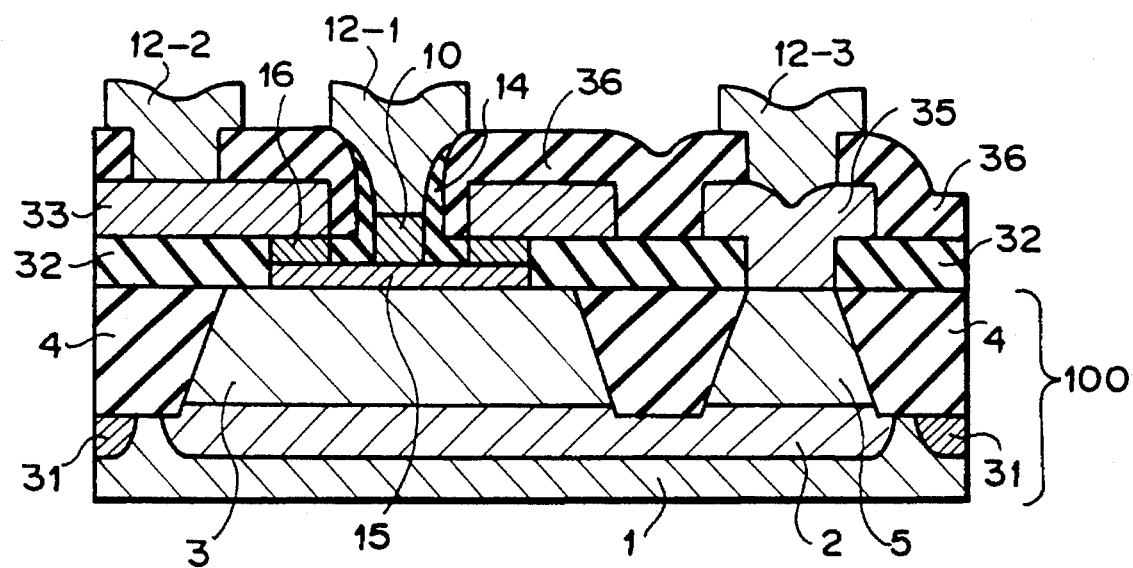
FIG. 5 is a longitudinally-sectional view showing a second embodiment of a semiconductor device obtained according to the present invention.

Referring to FIG. 5, in the semiconductor device of this embodiment, an alloy film of silicon and germanium is formed using Si$_2$H$_6$ and GeH$_4$ as raw gas when the base is grown by the UHV/CVD method. The same condition of the first embodiment for forming the base is used in this embodiment, and as an additive condition, GeH$_4$ is added in the following flow rate: Si$_2$H$_6$:GeH$_4$=3:2. With this addition, a single crystal silicon germanium alloy film 15 containing 10 mol % germanium is epitaxially grown on the collector 3.

Simultaneously with the growth of the alloy film 15, a single crystal silicon germanium alloy extrinsic base 16 is also grown on the lower surface of the overhang portion of the base electrode single crystal silicon 33, and then it is connected to the intrinsic base film 15.

The forbidden band gap of the silicon germanium alloy base film 15 becomes smaller than that of silicon which is used for the emitter. The reduction amount is dependent on the mol percentage of Ge and the strain of the silicon germanium alloy film. The difference in forbidden band gap acts as a barrier to minority carriers injected from the base to the emitter, so that increase of base current is suppressed. That is, the difference in the forbidden band gap improves the cut-off frequency $f_T$. Further, even when the base layer is designed to be thinner and highly doped to keep the break-down voltage $BV_{CEO}$ between the collector and the emitter to a predetermined value or more, the difference in the forbidden band gap also enables a current gain to be set to a sufficiently high value.

Figure 1:
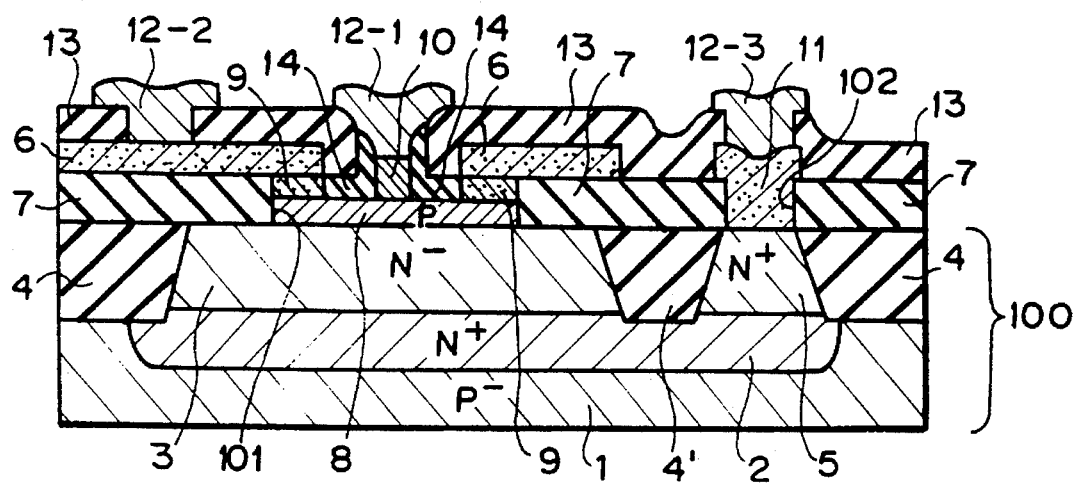
FIG. 1 is a longitudinally-sectional view showing a conventional semiconductor device.
Figure 2:
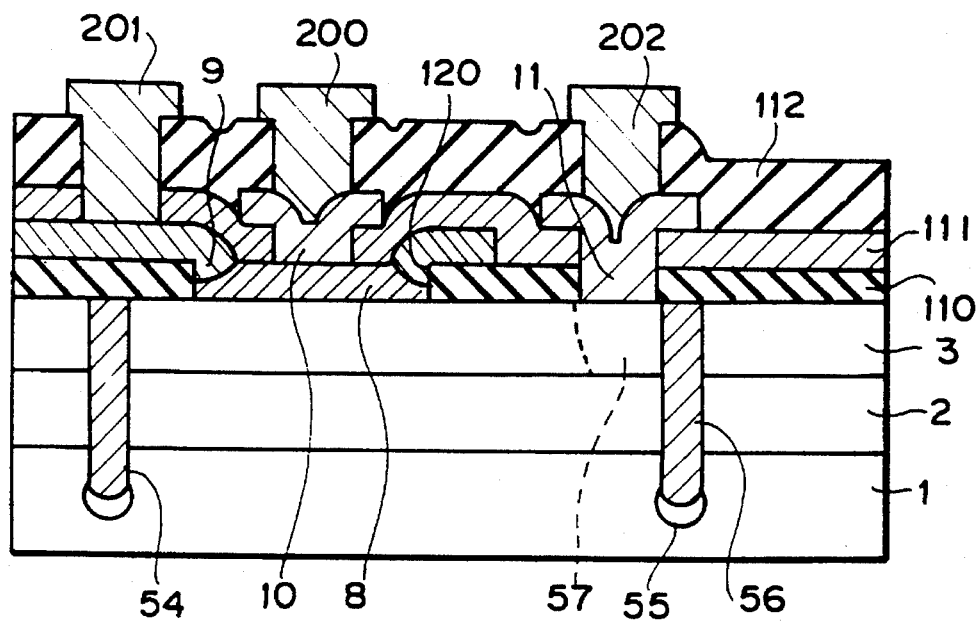
FIG. 2 is a longitudinally-sectional view showing another conventional semiconductor device.

In this embodiment, SiGe is used for the base, and the parasitic capacitance formed between the collector epitaxial layer 3 and the base electrode single crystal silicon film 33 is reduced because the distance between them is set to about 1000 Å in this embodiment. In the prior art technique, the extrinsic base polycrystalline SiGe film (as indicated by reference numeral 9 in FIG. 1) is set to about 100 to 150 Å in thickness, and the intrinsic base SiGe film is set to 500 Å in thickness, so that the intrinsic base is not connected to the extrinsic base unless the distance between the base electrode silicon and the collector epitaxial layer is set to about 600 Å or less. That is, according to this invention, the parasitic capacitance becomes 600Å/1000Å=0.6 times as compared with the prior art technique. In order to reduce the parasitic capacitance by the prior art technique, the intrinsic base must be thickened, and thus the cut-off frequency $f_T$ is lowered.

Further, in this embodiment, the base electrode silicon is made of single crystal, and thus the resistance of this portion is reduced.

Figure 6:
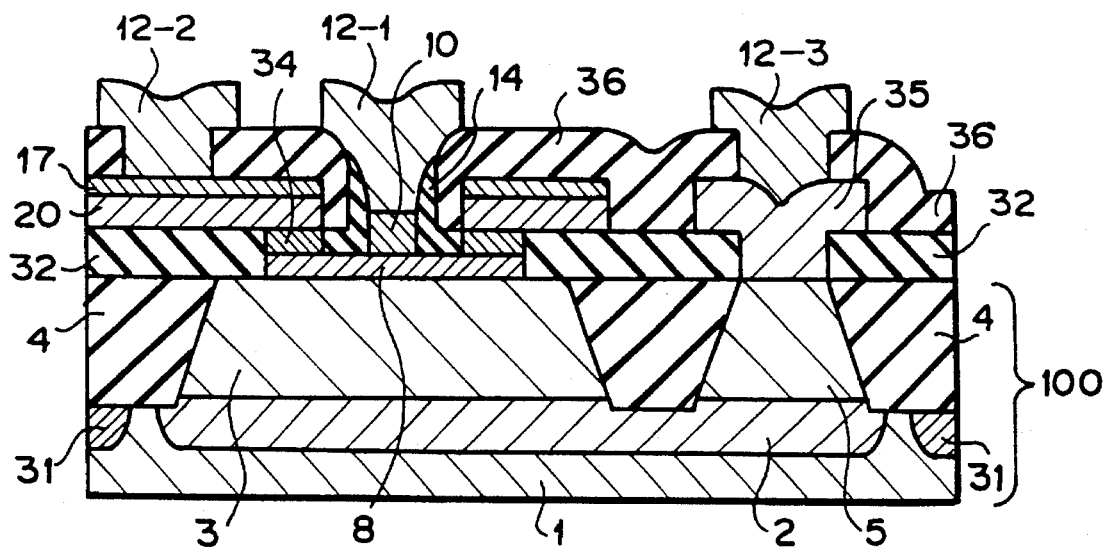
FIG. 6 is a longitudinally-sectional view showing a third embodiment of a semiconductor device obtained according to the present invention.

Next, a third embodiment according to the present invention will be described with reference to FIG. 6.

In this embodiment, the portion corresponding to the single crystal silicon film 33 of the first embodiment is replaced by a dual-layer structure of a $TiSi_2$ film 17 and a single crystal film 20. The other structure is identical to that of the first embodiment. With this structure, the base resistance can be more reduced because the $TiSi_2$ film 17 has low resistance.

In the manufacturing process for the semiconductor device of this embodiment, a Ti film is deposited on the single crystal silicon film 20 by the sputtering method, and then subjected to the heat treatment to obtain the dual-layer structure as described above. For example, when the thickness of the $TiSi_2$ film 17 is about 1000 Å while the thickness of the single crystal silicon film 20 is about 1500 Å and a predetermined wiring width is used, a sheet resistance $\rho_s$ is equal to 2 to 3Ω. This resistance value is equal to a half or less of the resistance value (8 to 9Ω) obtained when the thickness of the single crystal silicon film 33 is set to about 2500 Å and the same wiring width is used.

In the present invention, a metallic silicide other than titanium silicide ($TiSi_2$) may be used.

Figure 7:
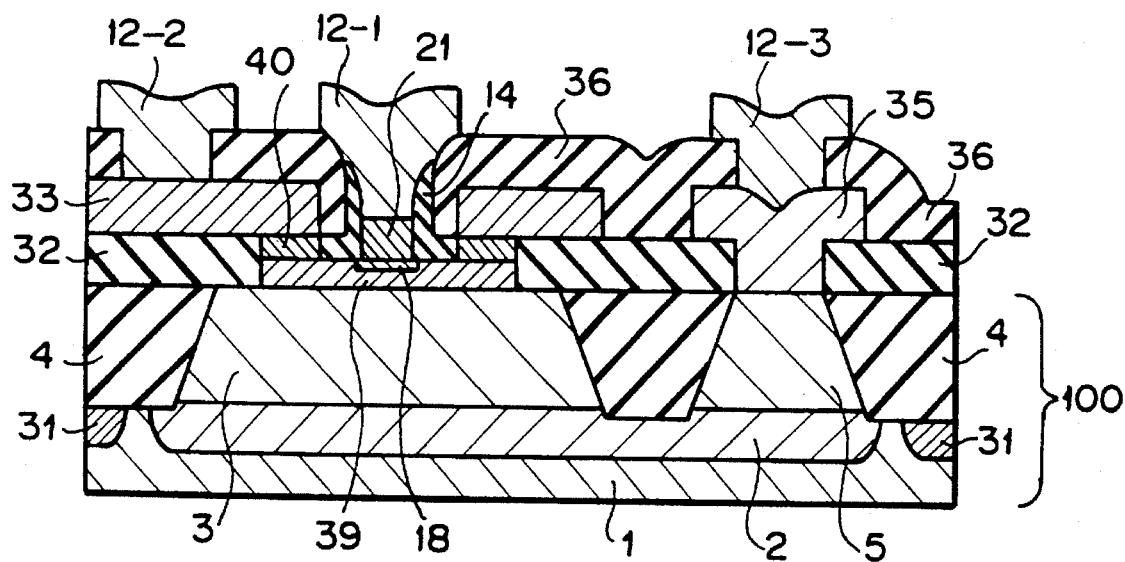
FIG. 7 is a longitudinally-sectional view showing a fourth embodiment of a semiconductor device obtained according to the present invention.
Figure 8:
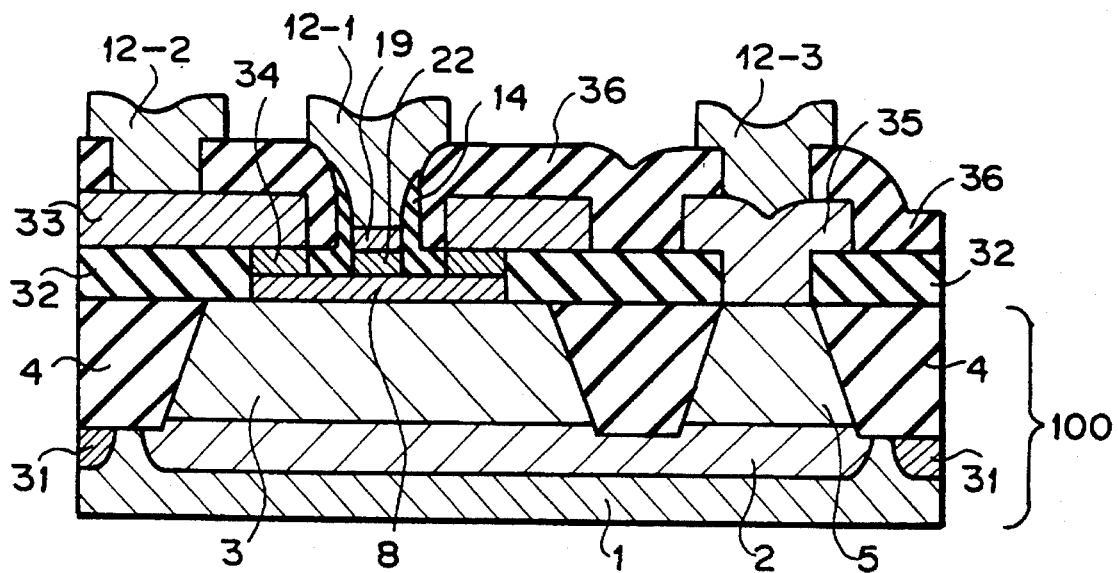
FIG. 8 is a longitudinally-sectional view showing a fifth embodiment of a semiconductor device obtained according to the present invention.

FIG. 7 is a cross-sectional view showing a semiconductor device of a fourth embodiment according to the present invention.

Referring to FIG. 7, the structure and the manufacturing process of this embodiment is almost identical to those of the first embodiment, and thus only the different points between this embodiment and the first embodiment will be described.

This embodiment is characterized by an emitter polycrystalline silicon film 21 doped with N-type impurities and an $N^+$-type emitter diffusion film 18. The intrinsic base film 39 is more thinned by a thickness corresponding to the $N^+$-type emitter diffusion film 18, so that increase of a switching speed of a transistor can be further promoted. In some cases, the contact surface between the base and the collector is slightly shifted to the collector side due to diffusion of impurities of the intrinsic base film into the epitaxial layer 3 when the emitter diffusion film 18 is formed.

In this embodiment, the depth of the emitter diffusion film 18 is about 200 Å, and thus the intrinsic base film 39 is formed by selectively and successively growing $Si_{0.9}Ge_{0.1}$ to a thickness of about 400 Å and then Si to a thickness of about 200 Å to make the intrinsic base as a SiGe alloy film. The boron concentration is about $6\times10^{18}$ cm$^{-3}$. As a result, the junction between the emitter and the collector is coincident with the hetero junction of $Si/Si_{0.9}Ge_{0.1}$, so that the improvement effect of the current gain $h_{FE}$ can be kept. In this case, the extrinsic base 40 also has a dual-layer structure of $Si_{0.9}Ge_{0.1}$.

A fifth embodiment according to the present invention will be described.

This embodiment is characterized by an emitter single crystal silicon film 22 doped with N-type impurities of $1\times10^{19}$ cm$^{-3}$ and an emitter electrode polycrystalline silicon film 19. The emitter electrode polycrystalline silicon film 19 contributes to reduction of the base current of a transistor, and thus it serves to improve the current gain. In addition, the silicon film 19 acts to prevent formation of an alloy layer between a wiring metal and the emitter single crystal silicon, which would be positioned in the neighborhood of the junction, in the heat treatment after the wiring metal is applied. Thus the destruction of the junction is hardly to occur.

As described above, according to the present invention, the base electrode silicon of single crystal is used, and thus the parasitic capacitance between the base and the collector can be reduced in the transistor in which the base is formed by the selective epitaxial growth, and particularly when SiGe is used for the base, the parasitic capacitance can be reduced to about 60%.

What is claimed is:

1. A method for manufacturing a semiconductor device, comprising:

a first step of forming a first insulation film on a surface of a first conduction type single crystal semiconductor layer;

a second step of forming on said first insulation film a first single crystal semiconductor film of a second conduction type through which a first opening is selectively formed;

a third step of forming a second insulation film on an upper surface of said first single crystal semiconductor film and on a side surface of said first single crystal semiconductor film which defines said first opening;

a fourth step of selectively removing said first insulation film using said second insulation film and said first single crystal semiconductor film as a mask to form through said first insulation film a second opening which is larger than said first opening;

a fifth step of growing a second single crystal semiconductor film of a second conduction type on an exposed surface of said first conductor type single crystal semiconductor layer within said second opening and growing a third single crystal semiconductor film of a second conduction type on an exposed lower surface of said first single crystal semiconductor film so that said second and third single crystal semiconductor films are connected to each other, said second and third single crystal semiconductor films being made of silicon-germanium; and a sixth step of forming a third insulation film between said second insulation film and said second single crystal semiconductor film so as to cover an exposed side surface of said third single crystal semiconductor film.

2. The method for manufacturing a semiconductor device as set forth in claim 1, wherein said first conduction type single crystal semiconductor layer and said first single crystal semiconductor film are made of silicon, and said second and third single crystal semiconductor films are made of silicon-germanium.

3. The method for manufacturing a semiconductor device as set forth in claim 1, wherein said first and third insulation films are made of silicon oxide, and said second insulation film is made of silicon nitride.

4. The method for manufacturing a semiconductor device as set forth in claim 1, wherein a metallic silicide film is formed on said first single crystal semiconductor film in said second step.

5. The method for manufacturing a semiconductor device as set forth in claim 1, wherein a single crystal semiconductor of a first conduction type is formed on the surface of a semiconductor substrate, an area of said single crystal semiconductor being used as said first conduction type single crystal semiconductor layer, and, in said second step, after a third opening is formed through said first single crystal semiconductor film at a portion corresponding to the other area of said single crystal semiconductor, an amorphous semiconductor is deposited, then, by a solid phase epitaxial growth method using said single crystal semiconductor at said other area in said third opening as a seed crystal, said amorphous semiconductor is crystallized to a single crystal semiconductor, and then a patterning of said crystallized single crystal semiconductor is carried out to obtain said first single crystal semiconductor film.

6. The method for manufacturing a semiconductor device as set forth in claim 1, further comprising a seventh step of forming a fourth single crystal semiconductor film of a first conduction type on an exposed surface of said second single crystal semiconductor film after said sixth step.

7. The method for manufacturing a semiconductor device as set forth in claim 6, wherein a polycrystalline silicon film is formed on said fourth single crystal semiconductor film in said seventh step.

8. The method for manufacturing a semiconductor device as set forth in claim 1, further comprising a eighth step of forming a polycrystalline silicon film of a first conduction type on an exposed surface of said second single crystal semiconductor film after said sixth step and diffusing impurities of a first conduction type from said polycrystalline silicon film to said second single crystal semiconductor film by heat treatment to form a first conduction type impurity diffusion area.

9. The method for manufacturing a semiconductor device as set forth in claim 1, wherein said second and third single crystal semiconductor films are grown at the same time under the same condition.

* * * * *